(12) United States Patent
Shimatani et al.

(10) Patent No.: US 6,620,978 B2
(45) Date of Patent: Sep. 16, 2003

(54) POSITIVE PHOTORESIST COMPOSITION AND PROCESS FOR SYNTHESIZING POLYPHENOL COMPOUND

(75) Inventors: Satoshi Shimatani, Kanagawa (JP); Ken Miyagi, Kanagawa (JP); Satoshi Niikura, Kanagawa (JP); Hidekatsu Kohara, Kanagawa (JP); Toshimasa Nakayama, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/207,840

(22) Filed: Jul. 31, 2002

(65) Prior Publication Data

US 2003/0054283 A1 Mar. 20, 2003

Related U.S. Application Data

(62) Division of application No. 09/635,404, filed on Aug. 10, 2000, now Pat. No. 6,492,085.

(30) Foreign Application Priority Data

Aug. 10, 1999 (JP) ............................................. 11-226526
Aug. 10, 1999 (JP) ............................................. 11-226527

(51) Int. Cl.$^7$ ........................... C07C 39/12; G03F 7/023
(52) U.S. Cl. ........................ 568/720; 568/717; 568/718; 430/193
(58) Field of Search .................................. 568/720, 717, 568/718; 430/193

(56) References Cited

U.S. PATENT DOCUMENTS

| | | | |
|---|---|---|---|
| 5,407,779 A | 4/1995 | Uetani et al. |
| 5,629,128 A | 5/1997 | Shirakawa et al. |
| 5,866,724 A | 2/1999 | Ichikawa et al. |
| 6,051,358 A | 4/2000 | Zampini et al. |
| 6,120,969 A | 9/2000 | Hagihara et al. |
| 6,127,087 A | 10/2000 | Kobayashi et al. |
| 6,171,750 B1 | 1/2001 | Inomata et al. |
| 6,207,788 B1 | 3/2001 | Miyagi et al. |
| 6,296,992 B1 | 10/2001 | Kurihara et al. |
| 6,300,033 B1 | 10/2001 | Suzuki et al. |
| 6,372,403 B1 | 4/2002 | Kurisaki et al. |
| 6,379,859 B2 | 4/2002 | Suzuki et al. |

FOREIGN PATENT DOCUMENTS

| JP | 7-168355 | 7/1995 |
|---|---|---|
| JP | 9-110751 | 4/1997 |

*Primary Examiner*—John S. Chu
(74) *Attorney, Agent, or Firm*—Sughrue Mion, PLLC

(57) ABSTRACT

The present invention provides a positive photoresist composition including (A) an alkali-soluble resin and (B) a photosensitizer, and the ingredient (B) is a quinonediazide ester of, for example, 2,6-bis[4-hydroxy-3-(2-hydroxy-3,5-dimethylbenzyl)-2,5-dimethylbenzyl]-4-methylphenol, where the average degree of esterification of 20% to 80%.

2 Claims, No Drawings

POSITIVE PHOTORESIST COMPOSITION AND PROCESS FOR SYNTHESIZING POLYPHENOL COMPOUND

This is a divisional of application Ser. No. 09/635,404, filed Aug. 10, 2000 and now U.S. Pat. No. 6,492,085; the disclosure of which is incorporated herein by reference.

BACKGROUND OF THE INVENTION

1. Field of the Invention

The present invention relates to positive photoresist compositions which can form a variety of resist patterns such as dense patterns, isolation patterns, and dot patterns with good shapes under the same exposure conditions.

2. Description of the Related Art

Logic integrated circuits (ICs) have highly added values and have received attention in recent years. In production of highly integrated logic ICs where a high definition of not more than half a micron is required, demands have been made to provide photoresist compositions which can form resist patterns including various patterns such as dense patterns, isolation patterns, and dot patterns with good shapes.

In addition, such photoresist compositions are required to form individual resist patterns with good shapes even under the same exposure conditions.

However, conventional photoresist compositions cannot satisfactorily form isolation patterns or dot patterns even though they satisfactorily form dense patterns. Even if they can form such patterns, the resulting individual patterns have greatly varied focal depth range properties under the same exposure conditions. The exposure conditions or mask pattern dimensions must be therefore changed or adjusted depending on the shapes of patterns to obtain satisfactory patterns.

In this connection, Japanese Patent Laid-Open No.6-167805 (conventional technology 1) and Japanese Patent Laid-Open No. 7-168355 (conventional technology 2) each disclose quinonediazide esters having specific structures as photosensitizers, and describe high-definition positive photoresist compositions containing the esters.

However, such positive photoresist compositions as concretely described in the conventional technologies 1 and 2 cannot form a variety of resist patterns with good shapes without changing exposure conditions.

Japanese Patent Laid-Open No. 9-110751 (conventional technology 3) describes phenol compounds shown by a wide-ranging general formula, and mentions that quinonediazide esters of the phenol compounds are useful as photosensitizers.

However, the conventional technology 3 lacks concrete description of esters according to the present invention. In addition, the conventional technology 3 describes a process for synthesizing a pentanuclear phenol compound, but this process is liable to form by-products and a target compound cannot be isolated in a high yield.

SUMMARY OF THE INVENTION

Accordingly, it is an object of the present invention to provide a positive photoresist composition which can form dense patterns, isolation patterns, dot patterns, and other various resist patterns with good shapes even under the same exposure conditions, and has satisfactory focal depth range properties in the formation of ultrafine resist patterns of not more than half a micron.

Another object of the invention is to provide a process for synthesizing a phenol compound shown by the following formula (I) in a high yield with minimized formation of by-products.

After intensive investigations, the present inventors found that a positive photoresist composition containing a quinonediazide ester of a compound of the following formula (I) in which the ester has an average degree of esterification of 20% to 80% can form dense patterns, isolation patterns, dot patterns, and other various resist patterns with good shapes even under the same exposure conditions and has satisfactory focal depth range properties.

Specifically, the invention provides, in an aspect, a positive photoresist composition including (A) an alkali-soluble resin, and (B) a photosensitizer. In this composition, the photosensitizer (B) includes a quinonediazide ester of a compound shown by the following formula (I), and the quinonediazide ester has an average degree of esterification of 20% to 80%:

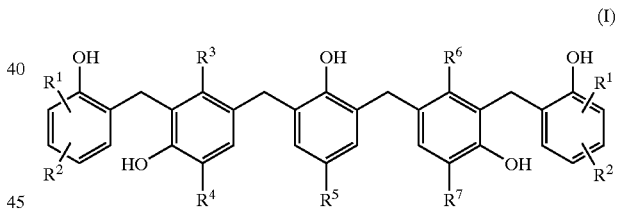

(I)

wherein each of $R^1$ to $R^7$ is, identical to or different from one another, an alkyl group having 1 to 3 carbon atoms or a cyclohexyl group.

The invented positive photoresist composition may include a quinonediazide ester of 2,6-bis[4-hydroxy-3-(2-hydroxy-3,5-dimethylbenzyl)-2,5-dimethylbenzyl]-4-methylphenol shown by the following formula (II) as the ingredient (B):

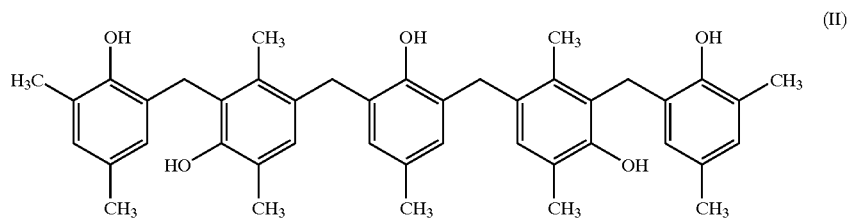

(II)

The invented positive photoresist composition preferably includes a quinonediazide ester of a compound shown by the following formula (III) as the ingredient (B):

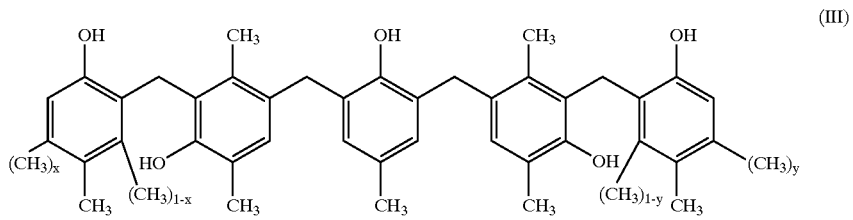

(III)

wherein each of x and y is, identical to or different from each other, an integer of 0 or 1.

The invention provides, in a further aspect, the positive photoresist composition wherein the photosensitizer (B) includes a quinonediazide ester of a compound shown by the following formula (VI):

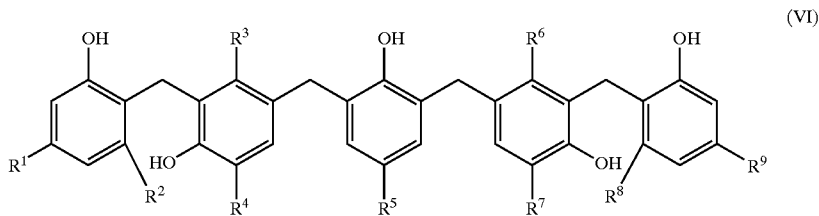

(VI)

each of $R^1$ to $R^9$ is, identical to or different from one another, an alkyl group having 1 to 3 carbon atoms or a cyclohexyl group.

The invented positive photoresist composition may include a quinonediazide ester of 2,6-bis[4-hydroxy-3-(2-hydroxy-4,6-dimethylbenzyl)-2,5-dimethylbenzyl]-4-methylphenol shown by the following formula (VII) as the ingredient (B):

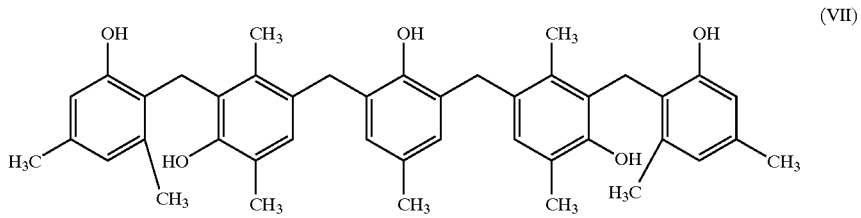

(VII)

In another aspect, the invention provides a process for synthesizing a polyphenol compound. This process includes the steps of adding, in the presence of an acid catalyst, a solution of a methylol-group-containing compound of the following formula (V) in an organic solvent:

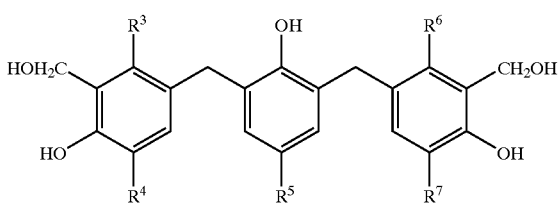

(V)

wherein each of R³ to R⁷ is, identical to or different from one another, an alkyl group having 1 to 3 carbon atoms or a cyclohexyl group, to a phenol compound shown by the following formula (IV):

(IV)

wherein each of $R^1$ and $R^2$ is, identical to or different form each other, an alkyl group having 1 to 3 carbon atoms or a cyclohexyl group, or to a solution of the phenol compound in an organic solvent, and performing a reaction to yield a polyphenyl compound shown by the following formula (I):

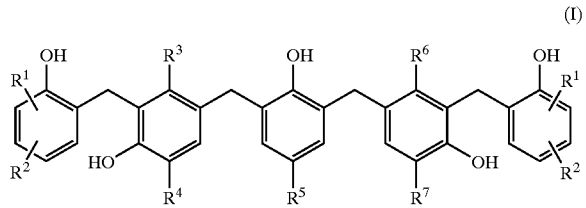

(I)

wherein each of $R^1$ to $R^7$ is, identical to or different from one another, an alkyl group having 1 to 3 carbon atoms or a cyclohexyl group.

In the above process, the organic solvents for use in dissolving the phenol compound and the methylol-group-containing compound are preferably good solvents for the polyphenol compound shown by the formula (I).

Each of the invented positive photoresist compositions may further include (C) a sensitizer (intensifier).

In the invented positive photoresist compositions, the proportion of the photosensitizer (B) may range from 10% to 60% by weight relative to the total weight of the ingredient (A) and the ingredient (C), where the ingredient (C) is added according to necessity.

Preferably, in the invented positive photoresist compositions, the quinonediazide ester may have an average degree of esterification of 40% to 60%.

DETAILED DESCRIPTION OF THE INVENTION (A) Alkali-soluble Resin

Alkali-soluble resins for use as the ingredient (A) are not limited and can be chosen from those generally used as film-forming substances in positive photoresist compositions. Of these resins, condensates of aromatic hydroxy compounds and aldehydes or ketones, polyhydroxystyrenes and derivatives thereof are preferable.

Such aromatic hydroxy compounds include, but are not limited to, phenol, m-cresol, p-cresol, o-cresol, 2,3-xylenol, 2,5-xylenol, 3,5-xylenol, 3,4-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, resorcinol, hydroquinone, pyrogallol, and other polyhydroxyphenols. Each of these compounds can be used alone or in combination.

The aldehydes include, but are not limited to, formaldehyde, paraformaldehyde, trioxane, acetaldehyde, propionaldehyde, butyraldehyde, trimethylacetaldehyde, acrolein (acrylaldehyde), crotonaldehyde, cyclohexanecarbaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination. Of these aldehydes, formaldehyde is desirable for its availability. Particularly, to improve heat resistance, the combination use of a hydroxybenzaldehyde and formaldehyde is preferred.

The ketones include, for example, acetone, methyl ethyl ketone, diethyl ketone, and diphenyl ketone. Each of these ketones may be used alone or in combination. Further, an appropriate combination of an aldehyde and a ketone can be employed.

The condensate of an aromatic hydroxy compound and an aldehyde or a ketone can be prepared in the presence of an acidic catalyst according to a known technique. Such acidic catalysts include, but are not limited to, hydrochloric acid, sulfuric acid, formic acid, oxalic acid, and p-toluenesulfonic acid.

The polyhydroxystyrenes and derivatives thereof include, but are not limited to, vinylphenol homopolymers, copolymers of vinylphenol and a copolymerizable comonomer. Such comonomers include, for example, acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene, and other styrene derivatives.

Of these alkali-soluble resins for use in the present invention as the ingredient (A), alkali-soluble novolak resins having a weight average molecular weight (Mw) of about 2000 to 20000, and typically about 3000 to 12000 are preferred. Among them, alkali-soluble novolak resins obtained by a condensation reaction of m-cresol and p-cresol with formaldehyde, or alkali-soluble novolak resins obtained by a condensation reaction of m-cresol, p-cresol, 2,3,5-trimethylphenol with formaldehyde are typically preferred. These alkali-soluble novolak resins can produce positive photoresist compositions having a high definition and a wide exposure margin.

(B) Photosensitizer

In the invention, quinonediazide esters of the compounds of the following formula (I) are used as the photosensitizer (B):

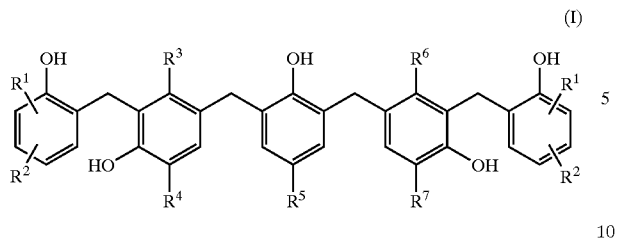
(I)

wherein each of $R^1$ to $R^7$ is, identical to or different from one another, an alkyl group having 1 to 3 carbon atoms or a cyclohexyl group.

Of these quinonediazide esters, preferred are quinonediazide esters of a compound of the following formula (II):

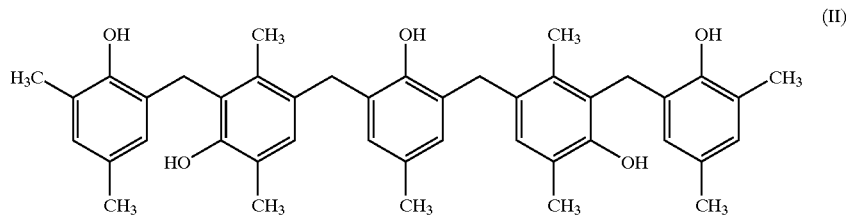
(II)

or of a compound of the following formula (III):

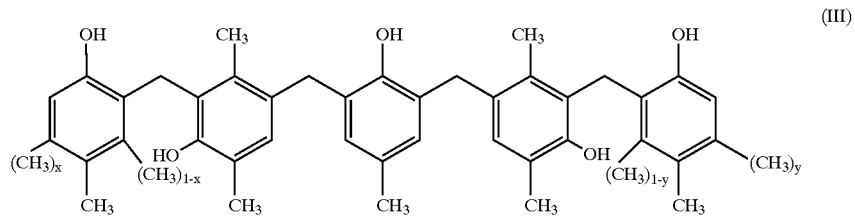
(III)

wherein each of x and y is, identical to or different from each other, an integer of 0 or 1.

Also, quinonediazide esters of compounds of the formula (VI) are preferred:

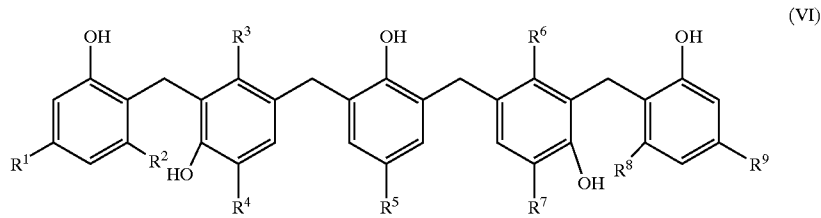
(VI)

wherein each of $R^1$ to $R^9$ is, identical to or different from one another, an alkyl group having 1 to 3 carbon atoms or a cyclohexyl group.

Of these quinonediazide esters, a quinonediazide ester of a compound of the following formula (VII) is preferred.

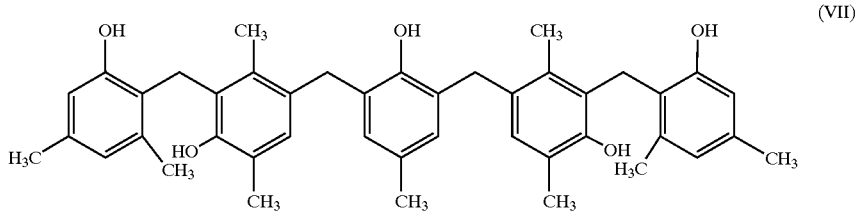

(VII)

In the compound of the formula (III), there are three isomers, in which x=y=1, x=0 and y=1, and x=y=0.

The polyphenol compound of the formula (I) should be preferably synthesized by the following process to obtained the polyphenyl compound of the formula (I) in a high yield and to minimize the formation of by-products. Specifically, the polyphenol compound of the formula (I) should be preferably synthetically obtained by adding, in the presence of an acid catalyst, a solution of a methylol-group-containing compound of the following formula (V) in an organic solvent:

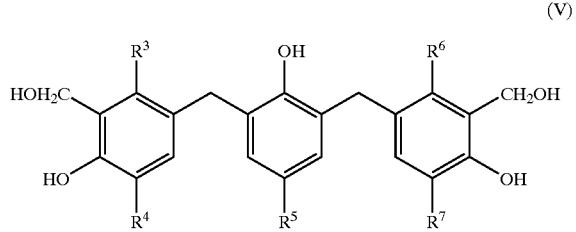

(V)

wherein each of $R^3$ to $R^7$ is, identical to or different from one another, an alkyl group having 1 to 3 carbon atoms or a cyclohexyl group, to a phenol compound shown by the following formula (IV):

(IV)

wherein each of $R^1$ and $R^2$ is, identical to or different form each other, an alkyl group having 1 to 3 carbon atoms or a cyclohexyl group, or to a solution of the phenol compound in an organic solvent, and performing a reaction.

When the phenol compound is solid at ordinary temperature, the phenol compound should be preferably used in the form of a solution in an organic solvent.

Organic solvents for use in dissolving the phenol compound or the methylol-group-containing compound are preferably good solvents for the polyphenol compound of the formula (I). As such solvents, γ-butyrolactone and mixtures of γ-butyrolactone with alcohols are preferred.

To minimize the formation of by-products and to obtain the target polyphenol compound in a high yield, it is preferred to add the methylol-group-containing compound as small portions as possible to large amounts of the phenol compound. In the invention, the methylol-group-containing compound can be quantitatively added in trace portions by using a solution of a methylol-group-containing compound which is solid at ordinary temperature.

By using a good solvent for the polyphenol compound as a reaction solvent, the reaction can be performed in a homogenous solution, and the formation of by-products and the remaining of unreacted materials can be suppressed to yield the polyphenol compound in a higher yield.

The more the proportion of the phenol compound relative to the methylol-group-containing compound is, the less by-products are formed. However, if excessively large amounts of the phenol compound is used, the target polyphenol compound cannot be significantly isolated from the material phenol compound. The proportion of the phenol compound is therefore preferably 2 to 50 moles, and more preferably 6 to 16 moles relative to 1 mole of the methylol-group-containing compound.

The reaction product (polyphenyl compound) can be taken out from a reaction system by putting a reaction mixture into large amounts of a poor solvent such as water to precipitate the reaction product.

The precipitated reaction product is separated by filtration, is recrystallized with a solvent such as butyl acetate, and the obtained crystal is washed with, for example, toluene and is dried to yield the target polyphenol compound.

Quinonediazide esters can be obtained by subjecting the polyphenol compound of the formula (I) to a condensation reaction (an esterification reaction) with a 1,2-naphthoquinonediazidesulfonyl halide. Such 1,2-naphthoquinonediazidesulfonyl halides include, for example, 1,2-naphthoquinonediazide-4-sulfonyl halides and 1,2-naphthoquinonediazide-5-sulfonyl halides.

The esterification reaction can be usually performed in an organic solvent in the presence of a basic condensing agent. Such organic solvents include, for example, dioxane, N-methylpyrrolidone, and dimethylacetamide, and such basic condensing agents include, for example, triethylamine, alkali carbonates or alkali hydrogencarbonates.

The esterification reaction should be preferably performed in such a manner as to achieve an average degree of esterification of 20% to 80%. To this end, the proportion of the 1,2-naphthoquinonediazidesulfonyl halide is preferably 1 to 4 moles, and more preferably 2 to 3 moles relative to 1 mole of the compound of the formula (I). The average degree of esterification well agrees with the proportions of individual ingredients and can be easily calculated from the added amount and unreacted amount of the 1,2-naphthoquinonediazidesulfonyl halide.

The average degree of esterification more preferably falls in a range from 40% to 60%. Within this range, the resulting photoresist composition can more advantageously form dense, isolation and dot resist patterns with good shapes under the same exposure conditions. If the average degree of esterification is less than 20%, a film residual rate of unexposed areas and definition are markedly decreased. In contrast, if it exceeds 80%, a sensitivity is markedly decreased.

The photosensitizer (B) for use in the invention may further comprise other quinonediazide esters to improve the sensitivity and definition. Such quinonediazide esters include, but are not limited to, quinonediazide esters of a polyphenol compound of the following formula (VIII):

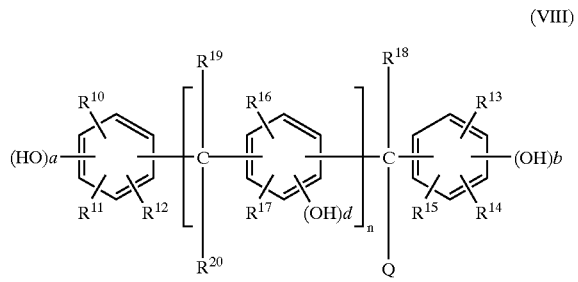
(VIII)

wherein each of $R^{10}$ to $R^{17}$ is independently a hydrogen atom, a halogen atom, an alkyl group having 1 to 6 carbon atoms, an alkoxy group having 1 to 6 carbon atoms, or a cycloalkyl group; each of $R^{18}$ to $R^{20}$ is independently a hydrogen atom or an alkyl group having 1 to 6 carbon atoms; Q is a hydrogen atom, an alkyl group having 1 to 6 carbon atoms, a cyclic ring having 3 to 6 carbon atoms as members as combined with $R^{18}$, or a residue of the following formula (IX); each of a and b is an integer of 1 to 3; d is an integer of 0 to 3; and n is an integer of 0 to 3:

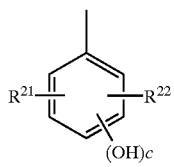
(IX)

wherein each of $R^{21}$ and $R^{22}$ is independently a hydrogen atom, a halogen atom, an alkyl group having 1 to 6 carbon atoms, an alkoxy group having 1 to 6 carbon atoms, or a cycloalkyl group; and c is an integer of 1 to 3. Concretely, preferred additional quinonediazide esters of polyphenol compounds include, for example, quinonediazide esters of: 2,4-bis(3,5-dimethyl-4-hydroxybenzyl)-5-hydroxyphenol, 2,6-bis(2,5-dimethyl-4-hydroxybenzyl)-4-methylphenol, and other linear trinuclear compounds; bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and other linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and other linear pentanuclear compounds; and other linear polyphenol compounds; tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis (4-hydroxyphenyl)-3-methoxy-4-hydroxyphenylmethane, bis (3-cyclohexyl-4-hydroxyphenyl)-3-hydroxyphenylmethane, bis (3-cyclohexyl-4-hydroxyphenyl)-2-hydroxyphenylmethane, bis (3-cyclohexyl-4-hydroxyphenyl)-4-hydroxyphenylmethane, bis (3-cyclohexyl-4-hydroxy-6-methylphenyl)-2-hydroxyphenylmethane, bis(3-cyclohexyl-4-hydroxy-6-methylphenyl)-3-hydroxyphenylmethane, bis (3-cyclohexyl-4-hydroxy-6-methylphenyl)-4-hydroxyphenylmethane, bis (3-cyclohexyl-4-hydroxy-6-methylphenyl)-3,4-dihydroxyphenylmethane, bis (3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis (3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, bis(4-hydroxy-2,3,5-trimethylphenyl)-4-hydroxy-3-methoxyphenylmethane, and other trisphenolic polyphenol compounds.

The proportion of the quinonediazide ester of the compound of the formula (I) should be preferably 10% by weight or more, and more preferably 50% by weight or more based on the total weight of the ingredient (B). Within this range, the above advantages of the invented composition can be preferably obtained.

The proportion of the ingredient (B) in the invented composition is preferably 10% to 60% by weight, and more preferably 20% to 50% by weight relative to the total weight of the alkali-soluble resin ingredient (A), and a sensitizer (intensifier) ingredient (C) added according to necessity as mentioned below. If the proportion of the ingredient (B) is less than the above range, images in exact accordance with patterns cannot be obtained, and transferring property is deteriorated. In contrast, if the proportion exceeds the above specified range, sensitivity and uniformity of the resulting resist film tend to be deteriorated to thereby deteriorate definition.

(C) Sensitizer (Intensifier)

Sensitizers (intensifiers) for use as the ingredient (C) in the invention are not limited, and any known sensitizers can be used. Such sensitizers include, but are not limited to, polyphenyl compounds of the formula (VIII). Of these compounds, preferred compounds are, for example, bis(4-hydroxy-2,3,5-trimethylphenyl)-2-hydroxyphenylmethane, 1,4-bis[1-(3,5-dimethyl-4-hydroxyphenyl)isopropyl]

benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis (4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis [1-(4-hydroxyphenyl)isopropyl]resorcin, 4,6-bis (3,5-dimethoxy-4-hydroxyphenylmethyl)pyrogallol, 4,6-bis (3,5-dimethyl-4-hydroxyphenylmethyl)pyrogallol, 2,6-bis (3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane. Among them, bis(4-hydroxy-2,3,5-trimethylphenyl)-2-hydroxyphenylmethane, bis(4-hydroxy-3,5-dimethylphenyl)-3,4-dihydroxyphenylmethane, 2,4-bis (3,5-dimethyl-4-hydroxyphenylmethyl)-6-methylphenol, 4,6-bis [1-(4-hydroxyphenyl)isopropyl]resorcin, and 1-[1-(4-hydroxyphenyl)isopropyl]-4-[1,1-bis (4-hydroxyphenyl)ethyl]benzene are typically preferred.

When the ingredient (C) is incorporated in the invented composition, the content of the ingredient (C) is preferably 5% to 50% by weight, and more preferably 10% to 35% by weight relative to the weight of the alkali soluble resin ingredient (A). The use of the sensitizer (intensifier) (C) within the above range is preferred to further improve exposure margin, definition, and focal depth range properties, and to provide a satisfactory sensitivity.

Where necessary, the invented composition may further comprise any of compatible additives including, for example, ultraviolet absorbents for inhibition of halation and surfactants for prevention of striation within a range not adversely affecting the advantages of the invention. Such ultraviolet absorbents include, for example, 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. Illustrative surfactants are available as Fluorade FC-430 and FC-431 (trade names, manufactured by Sumitomo 3M Ltd., Japan), F-TOP EF122A, EF122B, EF122C and EF126 (trade names, manufactured by Tochem Products Ltd., Japan), and other fluorine-containing surfactants.

The invented composition may preferably be used as a solution prepared by dissolving the ingredients (A), (B) and (C), and each of additional ingredients added according to necessity, in an appropriate solvent. Such solvents include solvents conventionally used for positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers, and other polyhydric alcohols and derivatives thereof; dioxane, and other cyclic ethers; and ethyl lactate, methyl acetate, ethyl acetate, butyl acetate, methylpyruvate, ethyl pyruvate, methyl methoxypropionate, ethyl ethoxypropionate, and other esters. Each of these solvents can be used alone or in combination. Particularly preferred solvents are acetone, methyl ethyl ketone, cyclohexanone, methyl isoamyl ketone, 2-heptanone, and other ketones; ethyl lactate, methyl acetate, ethyl acetate, butyl acetate, methylpyruvate, ethyl pyruvate, methyl methoxypropionate, ethyl ethoxypropionate, and other esters.

Practically, the invented composition may be used, for example, in the following manner. Each of the ingredients (A), (B) and (C), and other ingredients added according to necessity is dissolved in an appropriate solvent as mentioned above to yield a coating solution; the coating solution is then applied, using a spinner or the like, onto a substrate such as a silicon wafer or a substrate on which an antireflection coating has been formed, and is then dried to form a photosensitive layer; next, the photosensitive layer is irradiated and is exposed with an ultraviolet ray source such as a low-pressure mercury lamp, a high-pressure mercury lamp, an ultra-high-pressure mercury lamp, an arc lamp, or a xenon lamp, through a desired mask pattern, or irradiated with a scanning electron beam; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern.

EXAMPLES

The present invention will be further illustrated in detail with reference to several invented examples and comparative examples below.

Each of the characteristics of the positive photoresist compositions was evaluated according to the following manner, respectively, and the results are shown in Table 1.
(1) Sensitivity A sample was applied onto a silicon wafer using a spinner, and was dried on a hot plate at 90° C. for 90 sec. to form a resist film having a thickness of 1.05 $\mu$m. The resist film was then irradiated through a mask (reticle) corresponding to a 0.35$\mu$m resist pattern with line-and-space (L&S) of 1:1 for an increasing period from 0.1 sec. at intervals of 0.01 sec. using a reducing-type projection aligner NSR-2005i10D (manufactured by Nikon Corporation, Japan; NA=0.57). The film was then post-exposure baked (PEB) at 110° C. for 90 sec.; was subjected to developing in a 2.38% by weight tetramethylammonium hydroxide aqueous solution at 23° C. for 60 sec., was washed with water for 30 sec., and was dried. In this procedure, the sensitivity was defined as the exposure time period (Eop) (ms) to yield a 0.35-$\mu$m resist pattern with line-and-space (L&S) width of 1:1.
(2-1) Focal Depth Range Properties (Isolation Pattern)

A sample was subjected to exposure and development using a reducing-type projection aligner NSR-2005i10D (manufactured by Nikon Corporation, Japan; NA=0.57) at an exposure of Eop [the exposure time period to reproduce the set dimensions of mask pattern (line width 0.35 $\mu$m, line-and-space (L&S) 1:1)] as a standard exposure, where the focus was shifted up and down at this exposure. The obtained isolation resist pattern (width: 0.35 $\mu$m) was subjected to a scanning electron microscope (SEM) photographic observation. Based upon the SEM photograph, the focal depth range properties on isolation pattern were defined as the maximum value (μm) of the focal shift (defocus) to obtain a 0.35-μm rectangular resist pattern within a variation of ±10% of the set dimensions.

(2-2) Focal Depth Range Properties (Dense Pattern)

A sample was subjected to exposure and development using a reducing-type projection aligner NSR-2005i10D (manufactured by Nikon Corporation, Japan; NA=0.57) at an exposure of Eop [the exposure time period to reproduce the set dimensions of mask pattern (line width 0.35 μm, line-and-space (L&S) 1:1)] as a standard exposure, where the focus was shifted up and down at this exposure. The obtained dense resist pattern (line width 0.35 μm, line-and-space (L&S) 1:1) was subjected to an SEM photographic observation. Based upon the SEM photograph, the focal depth range properties on dense pattern was defined as the maximum value (μm) of the focal shift (defocus) to obtain a 0.35-μm rectangular resist pattern within a variation of ±10% of the set dimensions.

(2-3) Focal Depth Range Properties (Dot Pattern)

A sample was subjected to exposure and development using a reducing-type projection aligner NSR-2005i10D (manufactured by Nikon Corporation, Japan; NA=0.57) and a mask corresponding to a 0.6 μm×0.6 μm dot pattern and having a duty ratio of 2:1 (pitch between dots: 1.20 μm) at an exposure of Eop [the exposure time period to reproduce the set dimensions of mask pattern (line width 0.35 μm, line-and-space (L&S) 1:1)] as a standard exposure, where the focus was shifted up and down at this exposure. The obtained dot resist pattern (0.6 μm×0.6 μm) was subjected to an SEM photographic observation. Based upon the SEM photograph, the focal depth range properties on dot pattern were defined as the maximum value (μm) of the focal shift (defocus) to obtain a 0.6 μm×0.6 μm rectangular dot pattern within a variation of ±10% of the set dimensions.

(3) Total Focal Depth Range Properties

The total focal depth range properties were defined as the maximum (μm) of the focal shift (defocus) to obtain a 0.35-μm rectangular resist pattern within a variation of ±10 of the set dimensions in all the dense pattern, isolation pattern and dot pattern in the evaluations (2-1), (2-2) and (2-3).

(4) Definition

The definition was defined as the critical definition at an exposure which reproduced a 0.35-μm mask pattern with L&S of 1:1.

Synthesis Example 1

A total of 2.03 g of p-toluenesulfonic acid was added to 1 mole of 2,4-xylenol and was dissolved by stirring at 50° C. to 60° C. to yield a solution (solution 1).

Separately, 0.05 mole of 2,6-bis(2,5-dimethyl-4-hydroxy-3-methylolbenzyl)-4-methylphenol of the following formula was added to 150 g of a solvent mixture of γ-butyrolactone-methanol (125:25, by weight), and was dissolved by stirring at 25° C. to yield a solution (solution 2).

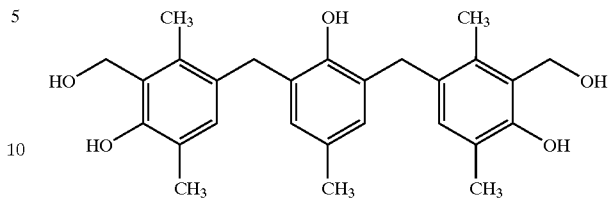

The above-prepared solution 2 was added dropwise to the solution 1 at a temperature of 60° C. over 30 to 60 minutes, and the resulting mixture was stirred for 3 hours while maintaining this temperature.

The reaction mixture was poured into 8 liters of pure water and was allowed to stand for 3 hours to precipitate a reaction product.

A reaction product was separated by filtration and was recrystallized in butyl acetate, and the obtained crystal was washed with toluene, and was dried to yield a solid matter.

An analysis of the product solid matter by gel permeation chromatography (GPC) found a peak of a compound of the following formula (II) and substantially no peak which was supposed to be derived from a by-product. A yield determined by a peak area on the basis of 2,6-bis(2,5-dimethyl-4-hydroxy-3-methylolbenzyl)-4-methylphenol was 89.6%.

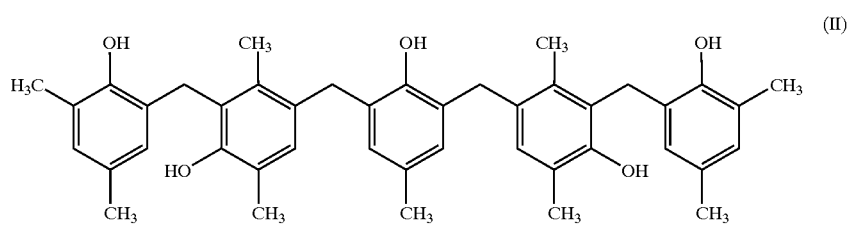

(II)

Synthesis Example 2

The synthesis procedure of Synthesis Example 1 was repeated to yield a solid matter, except that a solution (solution 3) was used instead of the solution 1 used in Synthesis Example 1. The solution 3 was obtained by adding 1 mole of 3,4-xylenol and 2.03 g of p-toluenesulfonic acid to 50 g of γ-butyrolactone, and stirring the resulting mixture at 50° C. to 60° C. to yield a solution.

A GPC analysis of the product solid matter found a peak of a compound of the following formula (III) and substantially no peak which was supposed to be derived from a by-product. A yield determined by a peak area on the basis of 2,6-bis(2,5-dimethyl-4-hydroxy-3-methylolbenzyl)-4-methylphenol was 92.9%:

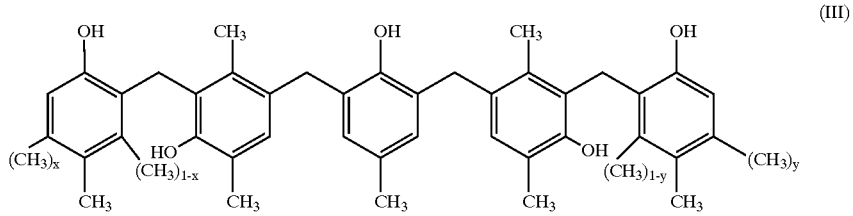

wherein each of x and y is, identical to or different from each other, an integer of 0 or 1.

Synthesis Example 3

A solution (solution 4) was prepared by adding 2.03 g of p-toluenesulfonic acid to 1 mole of 3,5-xylenol and stirring the resulting mixture at 50° C. to 60° C. to yield a solution.

Separately, another solution (solution 5) was prepared by adding 0.05 mole of 2,6-bis(2,5-dimethyl-4-hydroxy-3-methylolbenzyl)-4-methylphenol of the following formula to 150 g of a solvent mixture of γ-butyrolactone-methanol (125:25 by weight), and stirring the resulting mixture at 25° C. to yield a solution.

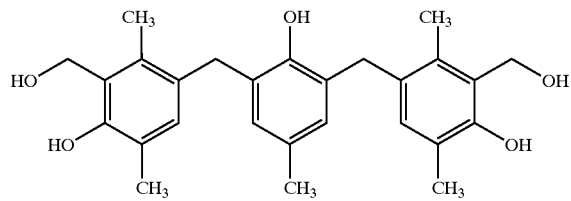

The above-prepared solution 5 was added dropwise to the solution 4 at a temperature of 60° C. over 30 to 60 minutes, and the resulting mixture was stirred for 3 hours while maintaining this temperature.

A reaction mixture was poured into 8 liters of pure water and was allowed to stand for 3 hours to precipitate a reaction product.

The reaction product was separated by filtration and was recrystallized in butyl acetate, and the obtained crystal was washed with toluene, and was dried to yield a compound of the following formula (VII):

into ten portions, and these ten portions were added to the solution 3 at a temperature of 60° C. over 30 to 60 minutes, and the resulting mixture was stirred for 3 hours while maintaining this temperature.

A reaction mixture was then poured into 8 liters of pure water and was allowed to stand for 3 hours to precipitate a reaction product.

The reaction product was separated by filtration, and was recrystallized in butyl acetate, and the obtained crystal was washed with toluene and was dried to yield a solid matter.

A GPC analysis of the product solid matter found a peak of the compound of the formula (III) and a multitude of peaks which were supposed to be derived from by-products. A yield determined by a peak area on the basis of 2,6-bis(2,5-dimethyl-4-hydroxy-3-methylolbenzyl)-4-methylphenol was 13.5%.

Example 1

Ingredient (A): alkali-soluble novolak resin [a novolak resin composed of m-cresol/p-cresol/2,3,5-trimethylphenol= 35/40/25 (by mole) and having a weight average molecular weight of 4500]

Ingredient (B): photosensitizer [a reaction product of 1 mole of the phenol compound (II) prepared in Synthesis Example 1 and 2.5 moles of 1,2-naphthoquinonediazide-5-sulfonyl chloride (hereinafter referred to as "5-NQD"), having an average degree of esterification of 50%]

Ingredient (C): sensitizer: 1-[1-(4-hydroxyphenyl)isopropyl]-4-[1,1-bis(4-hydroxyphenyl)ethyl]benzene In 2-heptanone, 100 parts by weight of the ingredient (A), 35 parts by weight of the ingredient (B), and 20 parts by weight of the ingredient (C) were dissolved, and the resulting solution was filtrated with a 0.2-μm membrane filter to yield a positive photoresist composition.

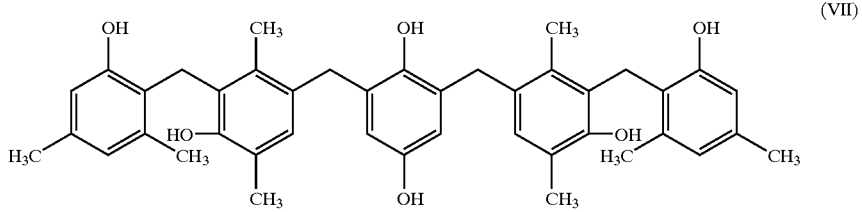

Comparative Synthesis Example

The solution 3 was prepared in the same manner as in Synthesis Example 2 by adding 1 mole of 3,4-xylenol and 2.03 g of p-toluenesulfonic acid to 50 g of γ-butyrolactone and stirring the resulting mixture at 50° C. to 60° C. to yield a solution.

A total of 0.05 mole of powdered 2,6-bis(2,5-dimethyl-4-hydroxy-3-methylolbenzyl)-4-methylphenol was divided Example 2

A positive photoresist composition was prepared in the same manner as in Example 1, except that a reaction product of 1 mole of the phenol compound (III) prepared in Synthesis Example 2 and 2.5 moles of 5-NQD was used instead of the ingredient (B) used in Example 1. This reaction product had an average degree of esterification of 50%.

Example 3

A positive photoresist composition was prepared in the same manner as in Example 1, except that a reaction product of 1 mole of the phenol compound (VII) prepared in Synthesis Example 3 and 2.5 moles of 5-NQD was used instead of the ingredient (B) used in Example 1. This reaction product had an average degree of esterification of 50%.

Comparative Example 1

A positive photoresist composition was prepared in the same manner as in Example 1, except that a reaction product of 1 mole of the following phenol compound and 2 moles of 5-NQD was used instead of the ingredient (B), used in Example 1. This reaction product had an average degree of esterification of 50%.

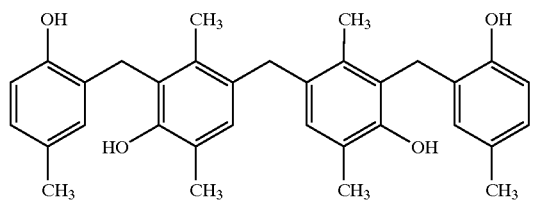

Comparative Example 2

A positive photoresist composition was prepared in the same manner as in Example 1, except that a reaction product of 1 mole of the following phenol compound and 2 moles of 5-NQD was used instead of the ingredient (B) used in Example 1. This reaction product had an average degree of esterification of 50%.

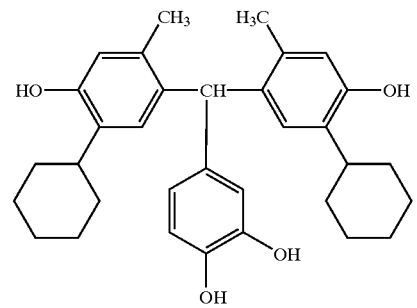

Comparative Example 3

A positive photoresist composition was prepared in the same manner as in Example 1, except that a reaction product of 1 mole of the following phenol compound and 2.5 moles of 5-NQD was used instead of the ingredient (B) used in Example 1. This reaction product had an average degree of esterification of 50%.

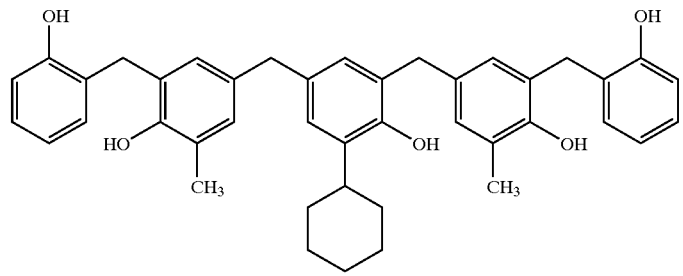

Comparative Example 4

A positive photoresist composition was prepared in the same manner as in Example 1, except that a reaction product of 1 mole of the phenol compound (II) prepared in Synthesis Example 1 and 0.5 mole of 5-NQD was used instead of the ingredient (B) used in Example 1. This reaction product had an average degree of esterification of 10%.

Comparative Example 5

A positive photoresist composition was prepared in the same manner as in Example 1, except that a reaction product of 1 mole of the phenol compound (II) prepared in Synthesis Example 1 and 4.5 moles of 5-NQD was used instead of the ingredient (B) used in Example 1. This reaction product had an average degree of esterification of 90%.

Comparative Example 6

A positive photoresist composition was prepared in the same manner as in Example 2, except that a reaction product of 1 mole of the phenol compound (III) prepared in Synthesis Example 2 and 0.5 mole of 5-NQD was used instead of the ingredient (B) used in Example 2. This reaction product had an average degree of esterification of 10%.

Comparative Example 7

A positive photoresist composition was prepared in the same manner as in Example 2, except that a reaction product of 1 mole of the phenol compound (III) prepared in Synthesis Example 2 and 4.5 moles of 5-NQD was used instead of the ingredient (B) used in Example 2. This reaction product had an average degree of esterification of 90%.

The characteristics (1), (2-1), (2-2), (2-3), (3), and (4) of these positive photoresist compositions prepared in Examples 1 to 3, and Comparative Examples 1 to 7 were evaluated, and the results are shown in Table 1.

TABLE 1

| Example | Sensitivity (ms) | Focal depth range properties (μm) | | | Total focal depth range properties | Definition (μm) |
|---|---|---|---|---|---|---|
| | | Isolation pattern | Dense pattern | Dot pattern | | |
| 1 | 295 | 1.0 | 1.2 | 0.8 | 0.8 | 0.32 |
| 2 | 440 | 1.4 | 1.6 | 1.0 | 1.0 | 0.28 |
| 3 | 490 | 1.2 | 1.6 | 0.8 | 0.8 | 0.28 |
| Comp. Ex. | | | | | | |
| 1 | 390 | 0.8 | 1.6 | 0.4 | 0.4 | 0.28 |
| 2 | 280 | 0.6 | 1.4 | 0.2 | 0.2 | 0.30 |
| 3 | 450 | 0.8 | 1.2 | 0.4 | 0.4 | 0.32 |
| 4 | 0.35 μm line and space were not resolved (no residual film) | | | | | |
| 5 | 740 | 0.2 | 0.6 | 0.2 | 0.2 | 0.35 |
| 6 | 0.35 μm line and space were not resolved (no residual film) | | | | | |
| 7 | 960 | 0.4 | 0.8 | 0.2 | 0.2 | 0.32 |

Table 1 shows that the invented compositions have satisfactory focal depth range properties in all the isolation patterns, dense patterns, and dot patterns and have high sensitivity and definition.

As thus described, the invention can provide positive photoresist compositions which can form dense patterns, isolation patterns, dot patterns, and other various resist patterns with good shapes even under the same exposure conditions, and have satisfactory focal depth range properties in the formation of ultrafine resist patterns of not more than half a micron.

Other embodiments and variations will be obvious to those skilled in the art, and this invention is not to be limited to the specific matters stated above.

What is claimed is:

1. A process for synthesizing a polyphenol compound, comprising the steps of:

adding, in the presence of an acid catalyst, a solution of a methylol-group-containing compound of the following formula (V) in an organic solvent:

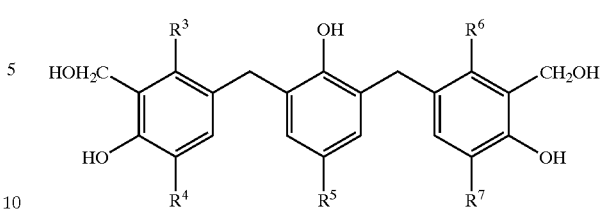

(V)

wherein each of $R^3$, $R^4$, $R^5$, $R^6$ and $R^7$ is, identical to or different from one another, an alkyl group having 1 to 3 carbon atoms or a cyclohexyl group, to a phenol compound shown by the following formula (IV):

(IV)

wherein each of $R^1$ and $R^2$ is, identical to or different form each other, an alkyl group having 1 to 3 carbon atoms or a cyclohexyl group, or to a solution of said phenol compound in an organic solvent, and performing a reaction to yield a polyphenyl compound shown by the following formula (I):

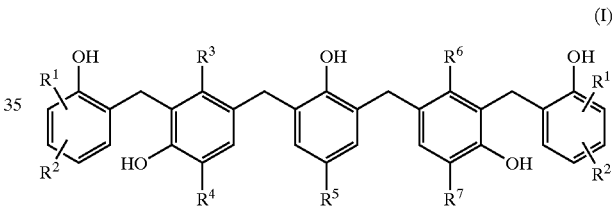

(I)

wherein each of $R^1$, $R^2$, $R^3$, $R^4$, $R^5$, $R^6$ and $R^7$ is, identical to or different from one another, an alkyl group having 1 to 3 carbon atoms or a cyclohexyl group.

2. A process according to claim 1, wherein said organic solvents for use in dissolving said phenol compound and said methylol-group-containing compound are good solvents for the polyphenol compound shown by the formula (I).

* * * * *